(12) United States Patent
Liu

(10) Patent No.: US 11,270,780 B2
(45) Date of Patent: Mar. 8, 2022

(54) MEMORY READOUT CIRCUIT AND METHOD

(71) Applicant: TAIWAN SEMICONDUCTOR MANUFACTURING CO., LTD., Hsinchu (TW)

(72) Inventor: Chih-Min Liu, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/028,837

(22) Filed: Sep. 22, 2020

(65) Prior Publication Data
US 2021/0304832 A1 Sep. 30, 2021

Related U.S. Application Data

(60) Provisional application No. 63/002,550, filed on Mar. 31, 2020.

(51) Int. Cl.
*G11C 17/18* (2006.01)
*G11C 17/16* (2006.01)
*G11C 11/16* (2006.01)

(52) U.S. Cl.
CPC .......... *G11C 17/18* (2013.01); *G11C 11/1673* (2013.01); *G11C 17/16* (2013.01); *G11C 11/161* (2013.01); *G11C 11/1659* (2013.01)

(58) Field of Classification Search
CPC .................................................... G11C 17/18
USPC ........................................................ 365/96
See application file for complete search history.

(56) References Cited

U.S. PATENT DOCUMENTS

| | | | |
|---|---|---|---|
| 9,449,685 B2 | 9/2016 | Yon | |
| 9,767,875 B2 | 9/2017 | Roy et al. | |
| 9,984,775 B2 | 5/2018 | Jeong | |
| 10,090,059 B2 | 10/2018 | Kim et al. | |
| 2009/0257274 A1* | 10/2009 | Itagaki | G11C 11/1675 365/158 |
| 2016/0141027 A1* | 5/2016 | Yon | G11C 7/16 365/148 |
| 2016/0162185 A1* | 6/2016 | D'Abreu | G11C 16/10 711/103 |
| 2018/0366207 A1 | 12/2018 | Zhang | |

(Continued)

OTHER PUBLICATIONS

Jong et al.,"A1 Mb 28nm STT-MRAM with 2.8ns Read AccessTime at 1.2 VVDD Using Single-Cap Offset-Cancelled sense Amplifier and In-situ Self-Write-Termination",2018 IEEE International Solid-State Circuits Conference,ISSCC 2018/ Session 30/ Emerging Memories/30.2;total 3 pages.*

(Continued)

*Primary Examiner* — Muna A Techane
(74) *Attorney, Agent, or Firm* — Hauptman Ham, LLP

(57) ABSTRACT

A circuit includes an OTP cell, an NVM cell, and a bit line coupled to the OTP cell, the NVM cell, and a first input terminal of an amplifier. The amplifier is configured to generate an output voltage based on a signal on the bit line, an ADC is configured to generate a digital output signal based on the output voltage, and a comparator includes a first input port coupled to an output port of the ADC and is configured to output a data bit responsive to a comparison of the digital output signal to a threshold level received at a second input port.

20 Claims, 7 Drawing Sheets

(56) References Cited

U.S. PATENT DOCUMENTS

2020/0219575 A1* 7/2020 Ha .................... G11C 17/16

OTHER PUBLICATIONS

Office Action dated Jun. 22, 2021 for corresponding case No. TW 11020588620. (pp. 1-5).
Dong et al., "A 1Mb 28nm STT-MRAM with 2.8ns Read Access Time at 1.2V VDD Using Single-Cap Offset-Cancelled Sense Amplifier and In-situ Self-Write-Termination", 2018 IEEE International Solid-State Circuits Conference, ISSCC 2018 / Session 30 / Emerging Memories / 30.2; total 3 pages.

* cited by examiner

MEMORY READOUT CIRCUIT AND METHOD

PRIORITY CLAIM

The present application claims the priority of U.S. Provisional Application No. 63/002,550, filed Mar. 31, 2020, which is incorporated herein by reference in its entirety.

BACKGROUND

In some applications, integrated circuits (ICs) include memory circuits that store data in non-volatile memory (NVM) in which data are not lost when the IC is powered off. Types of NVM cells include magnetic random-access memory (MRAM) cells, in which magnetic tunnel junctions (MTJs) are programmable to high and low resistance states that represent stored logical states, resistive random-access memory (ReRAM) cells programmable to high and low resistance states, and one-time-programmable (OTP) cells such as anti-fuse bits, in which electric fields are applied across dielectric layers to permanently alter (e.g., break down) one or more dielectric materials (oxides, etc.) to decrease resistance in programming operations. Often, to determine the logical state stored in an NVM cell, a signal is generated having a value based on a path resistance of the NVM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
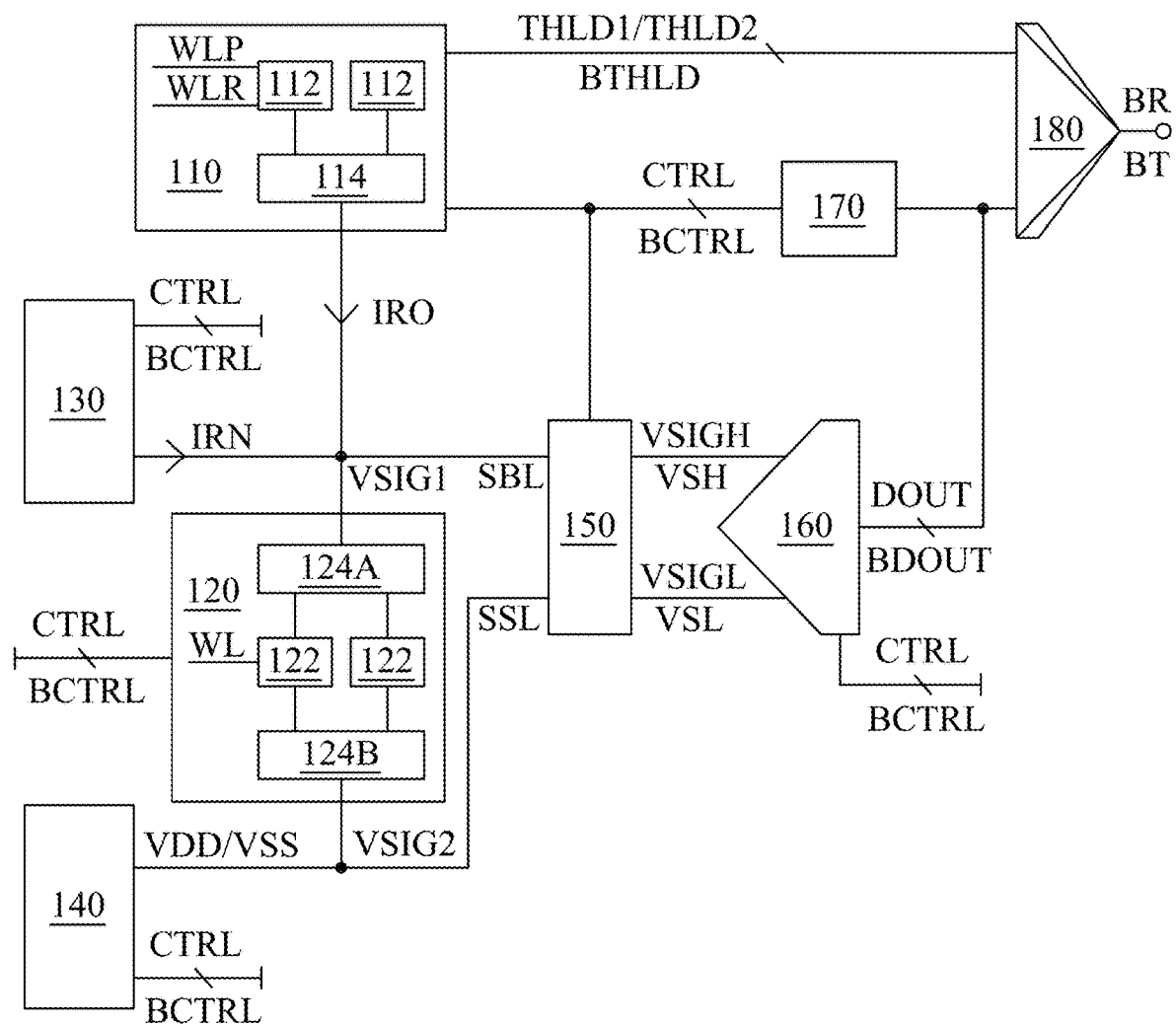
FIG. 1 is a schematic diagram of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a memory circuit includes a bit line coupled to both OTP cells and NVM cells. A read operation on an OTP cell generates a current signal on the bit line, a read operation on an NVM cell generates a voltage signal on the bit line, and an amplifier is configurable to generate an output voltage based on either bit line signal type. Based on the output voltage, an analog-to-digital converter (ADC) generates a digital output signal that is compared to a stored threshold level, the result of which is output as a data bit representative of a logical state of a selected one of the OTP and NVM cells. Compared to approaches in which banks of OTP and NVM cells include individual sensing circuits, the memory readout circuit is capable of reducing space requirements and increasing consolidation of readout functions.

In some embodiments, the memory circuit is used to determine and store at least one threshold level for each of the OTP and NVM cell types. Compared to approaches in which predetermined threshold levels are used, the memory circuit thereby improves accuracy and yield by setting the threshold levels based on measured memory cell parameters that can vary as a function of temperature, time, and manufacturing process tolerances.

FIG. 1 is a schematic diagram of a memory circuit 100, in accordance with some embodiments. Memory circuit 100, also referred to as a memory readout circuit 100 in some embodiments, is an IC including an OTP section 110, an NVM section 120, a configurable current source 130, a configurable voltage source 140, a configurable amplifier 150, an analog-to-digital converter (ADC) 160, a control circuit 170, and a digital comparator 180.

Each of OTP section 110, NVM section 120, configurable current source 130, and configurable amplifier 150 is coupled to a bit line SBL, also referred to as a shared bit line SBL in some embodiments. Each of NVM section 120, configurable voltage source 140, and configurable amplifier 150 is coupled to a source line SSL, also referred to as a shared source line SSL in some embodiments. Configurable amplifier 150 is coupled to ADC 160 through signal lines VSH and VSL, an output port (not labeled) of ADC 160 is coupled to an input port (not labeled) of control circuit 170 and an input port (not labeled) of digital comparator 180 through a digital output bus BDOUT, an output port (not labeled) of OTP section 110 is coupled to the input port of digital comparator 180 through a digital threshold bus BTHLD, and digital comparator 180 is coupled to an output terminal BT. Each of OTP section 110, NVM section 120, configurable current source 130, configurable voltage source 140, configurable amplifier 150, and ADC 160 is coupled to control circuit 170 through a control signal bus BCTRL.

Two or more circuit elements are considered to be coupled based on a direct electrical connection or a conductive path that includes one or more additional circuit elements, e.g., one or more switching devices or logic or transmission gates, and is thereby capable of being controlled, e.g., made resistive or open by a transistor or other switching device.

OTP section 110 is an IC, e.g., an electronic or electro-mechanical circuit, including a plurality of OTP cells 112 configured to be coupled to bit line SBL through a selection circuit 114. Each OTP cell 112 is an IC including one or more elements configured to have a first resistance level and capable of being permanently altered to have a second resistance level different from, i.e., greater than or less than, the first resistance level. The first and second resistance levels are thereby capable of representing corresponding first and second logical states. In some embodiments, one or more OTP cells 112 includes an anti-fuse bit, in which one or more dielectric layers are configured to be permanently altered (e.g., broken down) by an applied electric field such that a first resistance level of the one or more dielectric layers is significantly decreased to obtain a second resistance level. In some embodiments, one or more OTP cells 112 is an OTP cell 200 discussed below with respect to FIG. 2.

In some embodiments, OTP section 110 includes OTP cells 112 arranged as one or more banks or arrays. In some embodiments, OTP section 110 includes a number of OTP cells 112 ranging from 1 kilobit (kb) to 128 kb. In some embodiments, OTP section 110 includes a number of OTP cells 112 ranging from 16 kb to 64 kb.

A selection circuit, e.g., selection circuit 114, is an IC including one or more switching devices configured to electrically connect a first conductive path, e.g., bit line SBL, to a selected one of a plurality of additional conductive paths, e.g., local bit lines (not labeled) configured to couple OTP cells 112 to selection circuit 114, responsive to one or more control signals, e.g., one or more of control signals CTRL received on control signal bus BCTRL. In some embodiments, a selection circuit, e.g., selection circuit 114, includes one or more multiplexer (MUX) devices.

A switching device is an IC configured to selectively couple one or more pairs of terminals by providing one or more conductive paths responsive to one or more control signals, e.g., one or more of control signals CTRL. In various embodiments, a switching device includes a metal-oxide-semiconductor (MOS) or other type of transistor, a transmission gate, or other suitable IC device.

A given OTP cell 112 is configured to receive signals WLP and WLR and, responsive to signal WLR, e.g., a high or low logical level, electrically connect a first terminal of the corresponding one or more permanently alterable elements to the local bit line, e.g., through a switching device (not shown). The given OTP cell 112 is further configured to apply a voltage level of signal WLP to a second terminal of the corresponding one or more permanently alterable elements.

In read and write operations on the given OTP cell, the first terminal is connected through the local bit line and selection circuit 114 to bit line SBL in response to signal WLR and the control signal, and thereby has a reference voltage level, e.g., ground, equal to that of bit line SBL while the second terminal receives the voltage level of signal WLP.

In a write operation, signal WLP has a first voltage level relative to the reference voltage level configured to permanently alter the one or more permanently alterable elements. In a read operation, signal WLP has a second voltage level relative to the reference voltage level configured to cause a current IRO to flow to bit line SBL. Current IRO has a current level based on the second and reference voltage levels and the first or second resistance level of the corresponding one or more permanently alterable elements, the current level of current IRO thereby being indicative of the logical state of the given OTP cell 112.

Across the plurality of OTP cells 112, the first and second resistance levels vary in accordance with variations in physical properties related to one or more of process control, alteration or breakdown locations, temperature, wearout mechanisms, or the like.

In some embodiments, e.g., those in which OTP cell 112 is OTP cell 200 including an anti-fuse bit, current IRO has a first current level corresponding to the first resistance level and a second current level corresponding to the second significantly decreased resistance level, the second current level thereby being significantly greater than the first current level.

In some embodiments, OTP section 110 does not include selection circuit 114, or selection circuit 114 is configured to electrically connect bit line SBL to a subset of OTP cells 112, and all or a portion of OTP cells 112 are electrically connected directly to bit line SBL and individually selectable solely responsive to signal WLR.

NVM section 120 is an IC including a plurality of NVM cells 122 configured to be coupled to bit line SBL through a selection circuit 124A and to source line SSL through a selection circuit 124B. Each NVM cell 122 is an IC including one or more elements configured to be programmable to each of first and second resistance levels that are retained independently of a powered up or powered down state, the NVM cell 122 thereby being considered to be non-volatile and reconfigurable. The first and second resistance levels are thereby capable of representing corresponding first and second programmable logical states. In various embodiments, one or more NVM cells 122 includes a ReRAM cell, a conductive-bridging RAM (CBRAM) cell, a phase-change memory (PCM) cell, or an MRAM cell including an MTJ and is thereby programmable to the first and second resistance levels that represent stored logical states. In some embodiments, one or more NVM cells 122 is an NVM cell 300 discussed below with respect to FIG. 3.

In some embodiments, NVM section 120 includes NVM cells 122 arranged as one or more banks or arrays. In some embodiments, NVM section 120 includes a number of NVM cells 122 ranging from 128 kb to 64 megabits (Mb). In some embodiments, NVM section 120 includes a number of NVM cells 122 ranging from 1 Mb to 16 Mb.

Selection circuit 124A is coupled between bit line SBL and local bit lines (not labeled) corresponding to subsets of NVM cells 122, and selection circuit 124B is coupled between source line SSL and local source lines (not labeled) corresponding to the subsets of NVM cells 122. Selection circuits 124A and 124B are configured to simultaneously couple a given NVM cell 122 to each of bit line SBL and source line SSL responsive to one or more control signals, e.g., one or more of control signals CTRL received on control signal bus BCTRL. In various embodiments, selection circuits 124A and 124B are separate selection circuits or a same selection circuit. In some embodiments, one or both of selection circuits 124A or 124B includes one or more MUX devices.

A given NVM cell 122 is configured to receive a signal WL and, responsive to signal WL, e.g., through a first switching device (not shown), electrically connect a first terminal of the corresponding one or more programmably alterable elements to one of a bit line terminal connected to the local bit line, or a source line terminal connected to the local source line. In various embodiments, the given NVM cell 122 is configured to either directly connect a second terminal of the corresponding one or more programmably alterable elements to the other of the bit line terminal or source line terminal, or electrically connect the second terminal to the other of the bit line terminal or source line terminal responsive to signal WL, e.g., through a second switching device (not shown).

In read and write operations on the given NVM cell 122, in response to signal WL and the one or more control signals, the bit line terminal is connected to bit line SBL through selection circuit 124A and the source line terminal is connected to source line SSL through selection circuit 124B such that a current path including the one or more programmably alterable elements is established between bit line SBL and source line SSL. Configurable current source 130 and configurable voltage source 140 are controlled, as further discussed below, to cause a current IRN to flow through the current path, thereby generating a voltage difference between a voltage VSIG1 on bit line SBL and a voltage VSIG2 on source line SSL.

In a first write operation, current IRN has a first magnitude and first polarity configured to program the given NVM cell 122 to one of a high resistance level corresponding to a first physical state or a low resistance level corresponding to a second physical state. In a second write operation, current IRN has a second magnitude and second polarity configured to program the given NVM cell 122 to the other of the high resistance level corresponding to the first physical state or the low resistance level corresponding to the second physical state. In various embodiments, the first magnitude is equal to, greater than, or less than the second magnitude and the first polarity is the same as or opposite the second polarity.

In a read operation, current IRN has a third magnitude and a third polarity configured to generate voltage VSIG1 on bit line SBL and voltage VSIG2 on source line SSL having a voltage difference level corresponding to the resistance of the one or more programmably alterable elements, the voltage difference level between voltages VSIG1 and VSIG2 thereby being indicative of the logical state of the given NVM cell 121.

Across the plurality of NVM cells 122, the first and second resistance levels vary in accordance with variations in physical properties related to one or more of process control, alteration locations, temperature, wearout mechanisms, or the like.

In some embodiments, NVM segment 120 does not include selection circuit 124A, or selection circuit 124A is configured to electrically connect bit line SBL to a subset of NVM cells 122, and all or a portion of NVM cells 122 are electrically connected directly to bit line SBL and individually selectable solely responsive to signal WL. In some embodiments, NVM segment 120 does not include selection circuit 124B, or selection circuit 124B is configured to electrically connect bit line SBL to a subset of NVM cells 122, and all or a portion of NVM cells 122 are electrically connected directly to source line SSL and individually selectable solely responsive to signal WL.

Configurable current source 130 is an IC configured to provide current IRN on bit line SBL having one or more of a first current level having the first magnitude and the first polarity, a second current level having the second magnitude and the second polarity, or a third current level having the third magnitude and the third polarity responsive to one or more control signals, e.g., one or more control signals CTRL received on control signal bus BCTRL.

In some embodiments, configurable current source 130 includes a plurality of switching devices (not shown in FIG. 1) and a plurality of individual current sources (not shown in FIG. 1) configured to respond to the one or more control signals such that, in operation, configurable current source 130 is capable of providing current IRN having one or more of the first through third current levels. In some embodiments, configurable current source 130 is a configurable current source 400, discussed below with respect to FIG. 4, configured to provide current IRN having current levels IW0, IW1, and IR as the respective first through third current levels.

Configurable voltage source 140 is an IC configured to provide each of voltage levels VDD and VSS on source line SSL responsive to one or more control signals, e.g., one or more of control signals CTRL received on control signal bus BCTRL. Voltage level VDD is a power supply voltage level, e.g., the power supply voltage level of memory circuit 100, and voltage level VSS is a reference voltage level, e.g., the reference or ground voltage level of memory circuit 100. In various embodiments, configurable voltage source 140 is configured to provide one or more voltage levels on source line SSL instead of or in addition to voltage levels VDD and/or VSS.

In some embodiments, configurable voltage source 140 includes voltage nodes (not shown in FIG. 1) configured to carry voltages levels VDD and VSS, and one or more switching devices (not shown in FIG. 1) configured to respond to the one or more control signals such that, in operation, configurable voltage source 140 is capable of providing voltage levels VDD and VSS. In some embodiments, configurable voltage source 140 is a configurable voltage source 500, discussed below with respect to FIG. 5.

Memory circuit 100 is configured to generate the one or more control signals, e.g., control signals CTRL, such that, in operation, configurable current source 130 provides current IRN on bit line SBL having the one or more of the first through third current levels in coordination with configurable voltage source 140 providing voltage levels VDD and VSS on source line SSL, and in coordination with selection circuits 124A and 124B coupling a selected NVM cell 122 to bit line SBL and source line SSL. Memory circuit 100 is thereby configured to generate voltage VSIG1 on bit line SBL and voltage VSIG2 on source line SSL responsive to current IRN flowing through the selected NVM cell 122 and having any one of the first through third current levels. In some embodiments, memory circuit 100 is otherwise configured, e.g., by including configurable current source 130 combined with configurable voltage source 140, to generate voltage VSIG1 on bit line SBL and voltage VSIG2 on source line SSL responsive to current IRN flowing through the selected NVM cell 122 and having any one of the first through third current levels.

In some embodiments, e.g., those in which NVM cell 122 is NVM cell 300 discussed below with respect to FIG. 3, configurable current source 130 is configurable current source 400 discussed below with respect to FIG. 4, and configurable voltage source 140 is configurable voltage source 500 discussed below with respect to FIG. 5, and memory circuit 100 is thereby configured to generate current IRN having current level IW0 concurrently with configurable voltage source providing voltage VSS, current IRN having current level IW1 concurrently with configurable voltage source providing voltage VDD, and current IRN having current level IR concurrently with configurable voltage source providing voltage VSS. In such embodiments, in the read operation on the given NVM cell 122, memory circuit 100 generates voltage VSIG1 on bit line SBL and voltage VSIG2 on source line SSL based on current IRN having current level IR oriented in the positive polarity of current IRN indicated in FIG. 1.

Configurable amplifier 150 is an IC configured to generate voltages VSIGH and VSIGL on respective signal lines VSH and VSL in either a first operational mode or a second operational mode responsive to one or more control signals, e.g., one or more of control signals CTRL received on control signal bus BCTRL. In the first mode, configurable amplifier 150 is configured to generate voltages VSIGH and VSIGL having voltage levels indicative of a current level of current IRO received on bit line SBL. In the second mode, configurable amplifier 150 is configured to generate voltages VSIGH and VSIGL having voltage levels indicative of a difference between voltage levels of voltage VSIG1 received on bit line SBL and voltage VSIG2 received on source line SSL.

In some embodiments, signal line VSL is a reference node or otherwise configured to carry a reference voltage, e.g., ground, and configurable amplifier 150 is configured to generate voltage VSIGH solely indicative of either the current level of current IRO in the first mode or the difference between the voltage levels of voltages VSIG1 and VSIG2 in the second mode.

In some embodiments, configurable amplifier 150 includes an operational amplifier (op-amp) configured to operate as an integrator in the first mode and as an amplifier in the second mode. In some embodiments, configurable amplifier 150 is a configurable amplifier 600 discussed below with respect to FIG. 6.

Memory circuit 100 is configured to generate the one or more control signals, e.g., control signals CTRL, such that configurable amplifier 150 operates in the first mode concurrently with OTP section 110 providing current IRO on bit line SBL, and operates in the second mode concurrently with configurable current source 130 and configurable voltage source 140 providing current IRN having current level IR and with NVM section 120 thereby providing voltage VSIG1 on bit line SBL and voltage VSIG2 on source line SSL.

During the first operational mode of configurable amplifier 150, memory circuit 100 generates the one or more control signals, e.g., control signals CTRL, such that a given one of OTP cells 112 is selected responsive to signal WLR and coupled to bit line SBL, e.g., through selection circuit 114. Memory circuit 100 is configured as discussed above to provide signal WLP having the second voltage level to the selected OTP cell 112 such that current IRO received by configurable amplifier 150 on bit line SBL is based on the resistance level of the selected OTP cell 112, and configurable amplifier 150 generates voltages VSIGH and VSIGL having a voltage level difference indicative of the resistance level of the selected OTP cell 112 as part of a read operation on the selected OTP cell 112.

In response to the second voltage level of signal WLP, current IRO is generated having a range of current levels based on the range of values of the first and second resistance levels of the plurality of OTP cells 112 in OTP section 110, and configurable amplifier 150 generates voltages VSIGH and VSIGL having a corresponding first range of voltage level differences in the first operational mode.

During the second operational mode of configurable amplifier 150, memory circuit 100 generates the one or more control signals, e.g., control signals CTRL, such that a given one of NVM cells 122 is selected responsive to signal WL and coupled to bit line SBL, e.g., through selection circuit 124A, and to source line SSL, e.g., through selection circuit 124B. Memory circuit 100 is configured as discussed above to provide current IRN having current level IR to the selected NVM cell 122 such that voltages VSIG1 and VSIG2 received by configurable amplifier 150 on bit line SBL and source line SSL, respectfully, are based on the resistance level of the selected NVM cell 122, and configurable amplifier 150 generates voltages VSIGH and VSIGL having a voltage level difference indicative of the resistance level of the selected NVM cell 122 as part of a read operation on the selected NVM cell 122.

In response to current level IR of current IRN, voltages VSIG1 and VSIG2 are generated having a range of difference levels based on the range of values of the first and second resistance levels of the plurality of NVM cells 122 in NVM section 120, and configurable amplifier 150 generates voltages VSIGH and VSIGL having a corresponding second range of voltage level differences in the second operational mode.

The first and second ranges of voltage level differences between voltages VSIGH and VSIGL thereby correspond to an overall range of voltage level differences. In various embodiments, the overall range corresponds to one of the first or second ranges being the same, separate from, overlapping, or a subset of the other of the first or second ranges.

ADC 160 is an IC configured to receive voltages VSIGH and VSIGL on respective signal lines VSH and VSL, and to generate a multi-bit digital output signal DOUT on digital output bus BDOUT responsive to one or more control signals, e.g., one or more of control signals CTRL received on control signal bus BCTRL. ADC 160 is configured to generate the multiple bits of digital output signal DOUT having logical values indicative of the voltage level difference between voltages VSIGH and VSIGL by digitizing received voltages VSIGH and VSIGL based on a predetermined sampling period.

Digital output signal DOUT has a range of values corresponding to the overall range of voltage level differences between voltages VSIGH and VSIGL such that a resolution, or least-significant-bit (lsb) size, of digital output signal DOUT is based on the overall range of voltage level differences and the number of bits of digital output signal DOUT. For a given overall range of voltage level differences, the lsb size decreases as the number of bits increases. As the number of bits increases, one or more of circuit complexity, area, or digitization time increases such that a tradeoff against resolution exists.

In various embodiments, ADC 160 is configured to generate digital output signal DOUT having a fixed or variable number of bits. In some embodiments, ADC 160 is configured to generate digital output signal DOUT having the number of bits responsive to one or more control signals, e.g., one or more of control signals CTRL received on control signal bus BCTRL.

In some embodiments, ADC 160 is configured to generate digital output signal DOUT having the number of bits ranging from four to sixteen. In embodiments, ADC 160 is configured to generate digital output signal DOUT having the number of bits ranging from eight to twelve. In some embodiments, ADC 160 is configured to generate digital output signal DOUT having the number of bits equal to ten.

In various embodiments, ADC 160 is configured to generate digital output signal DOUT based on a fixed or variable sampling period and/or based on a fixed or variable sampling frequency. In various embodiments, ADC 160 is configured to generate digital output signal DOUT based on the sampling period and/or the sampling frequency responsive to one or more control signals, e.g., one or more of control signals CTRL received on control signal bus BCTRL.

Control circuit 170 is an IC configured to receive digital output signal DOUT and generate and output the one or more control signals CTRL on control signal bus BCTRL. In various embodiments, control circuit 170 includes one or a combination of one or more processors, one or more logic circuits, one or more memory circuits, or the like.

In various embodiments, control circuit 170 is configured as a sole control circuit of memory circuit 100 or as one of a plurality of control circuits, memory circuit 100 thereby being configured to output the one or more control signals CTRL configured to control one or more of OTP section 110, NVM section 120, configurable current source 130, configurable voltage source 140, configurable amplifier 150, or ADC 160 as discussed above and as further discussed below.

In some embodiments, control circuit 170 includes an interface (not shown) and is thereby configured to communicate with one or more circuits (not shown) external to memory circuit 100. In some embodiments, control circuit 170 is thereby configured to receive one or more instructions and/or one or more sets of data, e.g., information usable by memory circuit to perform one or more operations including storing data in one or both of OTP section 110 or NVM section 120.

In some embodiments, control circuit 170 is configured to cause memory circuit 100 to execute a plurality of write and read operations on some or all of OTP cells 112 of OTP section 110 and, based on a resultant plurality of values of digital output signal DOUT, determine a digital threshold THLD1 usable to distinguish between the first and second resistance levels of OTP cells 112. In some embodiments, control circuit 170 is configured to cause memory circuit 100 to execute a plurality of write and read operations on some or all of NVM cells 122 of NVM section 120 and, based on a resultant plurality of values of digital output signal DOUT, determine a digital threshold THLD2 usable to distinguish between the first and second resistance levels of NVM cells 122. In various embodiments, control circuit 170 is thereby configured to determine and/or store either one or both of digital thresholds THLD1 or THLD2, as further discussed below with respect to FIG. 9.

In the embodiment depicted in FIG. 1, control circuit 170 is configured to store digital thresholds THLD1 and THLD2 in OTP section 110. In various embodiments, control circuit 170 is configured to store one or both of digital thresholds THLD1 or THLD2 in NVM section 120 and/or one or more storage devices (not shown) other than OTP section 110 or NVM section 120. In some embodiments, control circuit 170 is configured to store one or both of digital thresholds THLD1 or THLD2 responsive to receiving the one or both of digital thresholds THLD1 or THLD2 from a circuit external to memory circuit 100.

In various embodiments, control circuit 170 is configured to store digital thresholds THLD1 and THLD2 having a number of bits the same as or different from the number of bits of digital output signal DOUT.

Digital comparator 180 is an IC configured to receive digital output signal DOUT on digital output bus BDOUT and one of digital thresholds THLD1 or THLD2 on digital threshold bus BTHLD, and, based on a comparison of digital output signal DOUT to the one of digital thresholds THLD1 or THLD2, generate an output bit BR on output terminal BT. In various embodiments, digital comparator 180 includes combinations of one or more types of logic circuits configured to generate output bit BR indicative of a result of the comparison.

In the embodiment depicted in FIG. 1, memory circuit 100 includes digital threshold bus BTHLD separate from digital output bus BDOUT. In some embodiments, digital threshold bus BTHLD and digital output bus BDOUT are a same digital bus.

Digital comparator 180 is thereby configured to generate output bit BR having one of a high or low logical value when digital output signal DOUT corresponds to a voltage level difference between voltages VSIGH and VSIGL greater than a voltage level difference corresponding to the received digital threshold THLD1 or THLD2, generate output bit BR having the other of the high or low logical value when digital output signal DOUT corresponds to a voltage level difference less than the voltage level difference corresponding to the received digital threshold THLD1 or THLD2, and in various embodiments, having either one of the high or low logical values when digital output signal DOUT is the same as the received digital threshold THLD1 or THLD2.

Memory circuit 100 including control circuit 170 is thereby configured as discussed above to perform a read operation on a selected OTP cell 112 by generating current IRO having a current level indicative of a resistance level of the selected OTP cell 112, using configurable amplifier 150 in the first operational mode to generate voltages VSIGH and VSIGL having a voltage level difference based on the current level, using ADC 160 to generate digital output signal DOUT based on the voltage level difference, and using digital comparator 180 to generate output bit BR having a logical value based on a result of a comparison of digital output signal DOUT to digital threshold THLD1. Because digital threshold THLD1 is usable to distinguish between the first and second resistance levels of the selected OTP cell 112, output bit BR has the logical value indicative of the programmed logical state of the selected OTP cell 112 in the read operation.

Memory circuit 100 including control circuit 170 is thereby configured as discussed above to perform a read operation on a selected NVM cell 122 by generating voltages VSIG1 and VSIG2 having a first voltage level difference indicative of a resistance level of the selected NVM cell 122, using configurable amplifier 150 in the second operational mode to generate voltages VSIGH and VSIGL having a second voltage level difference based on the first voltage level difference, using ADC 160 to generate digital output signal DOUT based on the second voltage level difference, and using digital comparator 180 to generate output bit BR having a logical value based on a result of a comparison of digital output signal DOUT to digital threshold THLD2. Because digital threshold THLD2 is usable to distinguish between the first and second resistance levels of the selected NVM cell 122, output bit BR has the logical value indicative of the programmed logical state of the selected NVM cell 122 in the read operation.

Memory circuit 100 is thereby configured to generate output bit BR on output terminal BT having logical states indicative of programmed logical states of each OTP cell 112 of OTP section 110 and each NVM cell 122 of NVM section 120. Compared to approaches in which banks of OTP and NVM cells include individual sensing circuits, memory circuit 100 is capable of reducing space requirements, increasing consolidation of readout functions, and improving accuracy by determining and saving threshold levels based on measured memory cell parameters.

Figure 2:
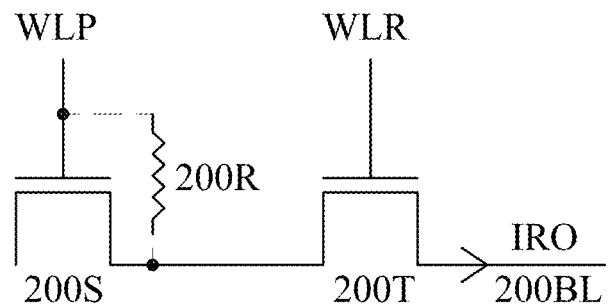
FIG. 2 is a schematic diagram of an OTP cell, in accordance with some embodiments.

FIG. 2 is a schematic diagram of OTP cell 200, in accordance with some embodiments. OTP cell 200 is usable as one or more of OTP cells 112 discussed above with respect to FIG. 1.

OTP cell 200 includes an anti-fuse structure 200S and a transistor 200T. A source/drain (S/D) terminal (not labeled) of anti-fuse structure 200S is shared with a first S/D terminal of transistor 200T, and a second S/D terminal of transistor 200T is coupled to a local bit line 200BL. A gate of anti-fuse structure 200S is configured to receive signal WLP and a gate of transistor 200T is configured to receive signal WLR.

In the embodiment depicted in FIG. 2, each of anti-fuse structure 200S and transistor 200T is an n-type transistor. In various embodiments, one or both of anti-fuse structure 200S or transistor 200T is a p-type transistor.

A path between the gate of anti-fuse structure 200S and the S/D terminal shared with transistor 200T is represented as resistance 200R. Based on a manufacturing technology by which OTP cell 200 is constructed, resistance 200R has a first resistance level as discussed above with respect to OTP cell 112 and FIG. 1.

In programming and read operations, signal WLR is applied to the gate of transistor 200T having a logical value, e.g., a high logical value, configured to cause anti-fuse structure 200S to be selectively coupled to local bit line 200BL, configured to have a reference voltage level, e.g., ground.

In the programming operation, signal WLP is applied to the gate of anti-fuse structure 200S having a voltage level relative to the reference voltage level on local bit line 200BL configured to permanently alter, or break down, one or more oxide layers between the gate and S/D terminal, thereby causing resistance 200R to decrease to the second resistance level less than the first resistance level.

In the read operation, signal WLP is applied to the gate of anti-fuse structure 200S having a voltage level relative to the reference voltage level on local bit line 200BL configured to cause current IRO to flow through local bit line 200BL to bit line SBL, as discussed above with respect to memory circuit 100 and FIG. 1.

OTP cell 200 is thereby configured such that a memory circuit, e.g., memory circuit 100, including OTP cell 200 generates current IRO having a current level based on the levels of signal WLP and resistance 200R and is thereby capable of realizing the benefits discussed above with respect to memory circuit 100.

Figure 3:
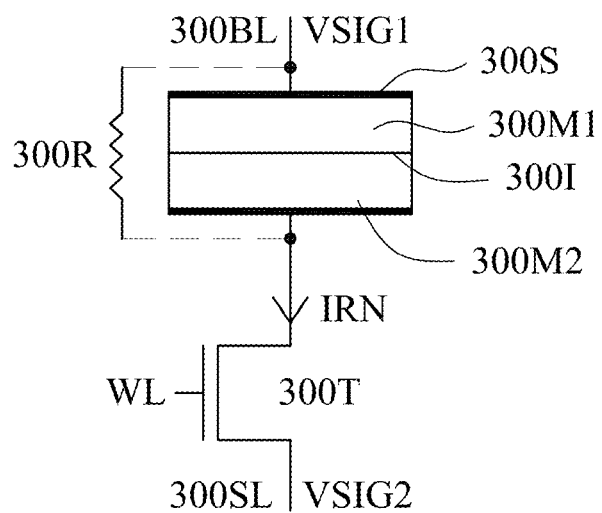
FIG. 3 is a schematic diagram of an NVM cell, in accordance with some embodiments.

FIG. 3 is a schematic diagram of NVM cell 300, in accordance with some embodiments. NVM cell 300 is usable as one or more of NVM cells 122 discussed above with respect to FIG. 1 and is also referred to as an MRAM cell 300 in some embodiments.

NVM cell 300 includes an MTJ structure 300S and a transistor 300T. MTJ structure 300S includes a first terminal coupled to a local bit line 300BL and a second terminal coupled to a first S/D terminal of transistor 300T, and transistor 300T includes a second S/D terminal coupled to a local source line 200SL. A gate of transistor 300T is configured to receive signal WL.

In the embodiment depicted in FIG. 3, transistor 300T is an n-type transistor coupled between MTJ structure 300S and local source line 300SL. In various embodiments, transistor 300T is a p-type transistor and/or is coupled between MTJ structure 300S and local bit line 300BL.

Magnetic layers 300M1 and 300M2 are positioned between the two terminals of MTJ structure 300S and are separated by an insulation layer 300I. Magnetic layer 300M2 has a pinned magnetic orientation and magnetic layer 300M1 has a magnetic orientation configurable to be either aligned with or opposite that of magnetic layer 300M2. Insulation layer 300I is configured to conduct a tunneling current such that a resistance 300R of MTJ structure 300S has the first resistance level corresponding to magnetic layers 300M1 and 300M2 having aligned orientations and the second resistance level corresponding to magnetic layers 300M1 and 300M2 having opposite orientations, the second resistance level being greater than the first resistance level.

In a first programming operation, current IRN having current level IW0 is applied to NVM cell 300, as discussed above with respect to memory circuit 100 and FIG. 1, thereby having the positive polarity and magnitude sufficiently large to cause the magnetic orientation of magnetic layer 300M1 to align with that of magnetic layer 300M2 such that NVM cell 300 is programmed to a first logical state corresponding to the first resistance level of resistance 300R.

In a second programming operation, current IRN having current level IW1 is applied to NVM cell 300, thereby having the negative polarity and magnitude sufficiently large to cause the magnetic orientation of magnetic layer 300M1 to be opposite that of magnetic layer 300M2 such that NVM cell 300 is programmed to a second logical state corresponding to the second resistance level of resistance 300R.

In a read operation, current IRN having current level IR is applied to NVM cell 300, thereby having a magnitude sufficiently small to avoid altering an orientation of magnetic layer 300M1 and sufficiently large to generate a difference between voltages VSIG1 and VSIG2 capable of being detected by an amplifier, e.g., received by configurable amplifier 150 discussed above with respect to memory circuit 100 and FIG. 1. In various embodiments, current IRN having current level IR has either the positive or negative polarity in the read operation.

NVM cell 300 is thereby configured such that a memory circuit, e.g., memory circuit 100, including NVM cell 300 generates voltages VSIG1 and VSIG2 having a voltage difference level based on the levels of current IRN and resistance 300R and is thereby capable of realizing the benefits discussed above with respect to memory circuit 100.

Figure 4:
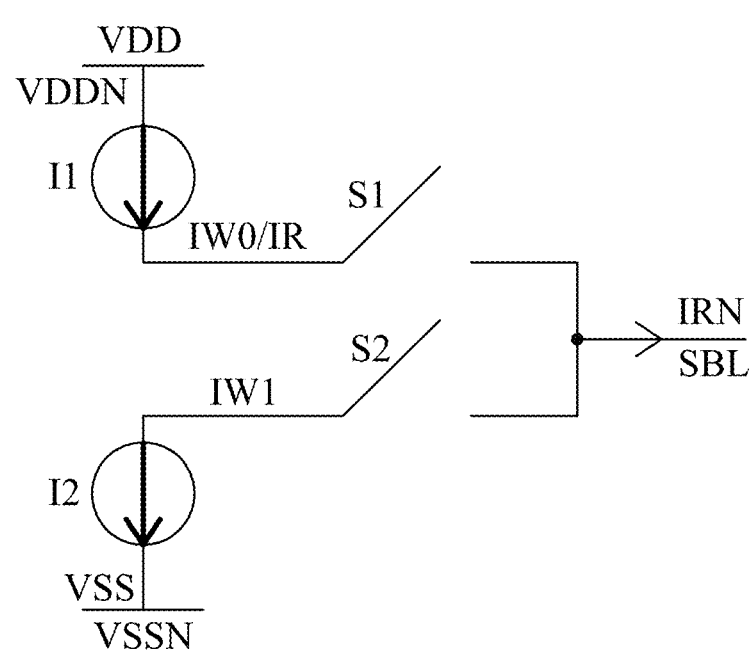
FIG. 4 is a schematic diagram of a configurable current source, in accordance with some embodiments.

FIG. 4 is a schematic diagram of configurable current source 400, in accordance with some embodiments. Configurable current source 400 is usable as configurable current source 130 discussed above with respect to FIG. 1.

Configurable current source 400 includes a power supply node VDDN, a power supply reference node VSSN, current sources I1 and I2, and switching devices S1 and S2. Current source I1 and switching device S1 are coupled in series between power supply node VDDN and bit line SBL, discussed above with respect to memory circuit 100 and FIG. 1. Current source I2 and switching device S2 are coupled in series between power supply reference node VSSN and bit line SBL.

Power supply node VDDN is one or more conductive paths configured to carry a power supply voltage VDD, and power supply reference node VSSN is one or more conductive paths configured to carry a power supply reference voltage VSS, e.g., a ground having a ground voltage level.

Current source I1 is an IC configured to provide a current having either current level IW0 or current level IR responsive to one or more control signals, e.g., one or more control signals CTRL discussed above with respect to memory circuit 100 and FIG. 1, and current source I2 is an IC configured to provide a current having current level IR, each discussed above with respect to memory circuit 100 and FIG. 1.

Switching devices S1 and S2 are configured to receive one or more control signals (not shown), e.g., one or more of control signals CTRL discussed above with respect to memory circuit 100 and FIG. 1, and to open and close in a complementary arrangement responsive to the one or more control signals.

In the embodiment depicted in FIG. 4, configurable current source 400 is thereby configured to provide current IRN on bit line SBL having any one of current level IW0 having the positive polarity, current level IR having the positive polarity, or current level IW1 having the negative polarity. In various embodiments, configurable current source 400 is otherwise configured, e.g., by including an additional current source and switching device (not shown) configured to provide one of current levels IW0 or IR, to provide current IRN on bit line SBL as discussed above.

Configurable current source 400 is thereby configured such that a memory circuit, e.g., memory circuit 100, including configurable current source 400 provides current IRN capable of generating voltages VSIG1 and VSIG2 as discussed above with respect to FIGS. 1 and 3 and is thereby capable of realizing the benefits discussed above with respect to memory circuit 100.

Figure 5:
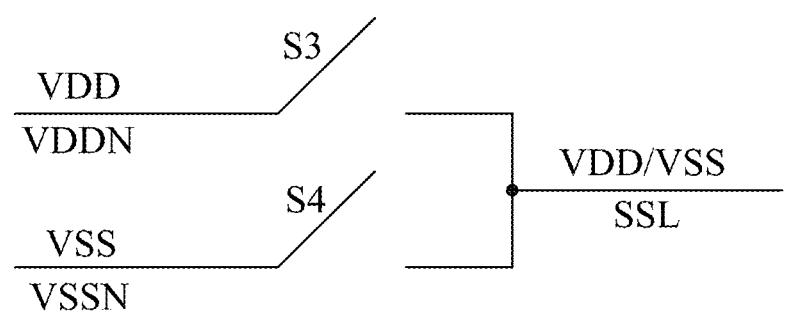
FIG. 5 is a schematic diagram of a configurable voltage source, in accordance with some embodiments.

FIG. 5 is a schematic diagram of configurable voltage source 500, in accordance with some embodiments. Configurable voltage source 500 is usable as configurable voltage source 140 discussed above with respect to FIG. 1.

Configurable voltage source 500 includes power supply node VDDN and power supply reference node VSSN, each discussed above with respect to FIG. 4, and switching devices S3 and S4. Switching device S3 is coupled between power supply node VDDN and source line SSL, discussed above with respect to memory circuit 100 and FIG. 1, and switching device S4 is coupled between power supply reference node VSSN and source line SSL.

Switching devices S3 and S4 are configured to receive one or more control signals (not shown), e.g., one or more of control signals CTRL discussed above with respect to memory circuit 100 and FIG. 1, and to open and close in a complementary arrangement responsive to the one or more control signals.

In the embodiment depicted in FIG. 5, configurable voltage source 500 is thereby configured to provide either one of power supply voltage VDD or power supply reference voltage VSS on source line. In various embodiments, configurable voltage source 500 is otherwise configured to provide one of power supply voltage VDD, power supply reference voltage VSS, or one or more voltages (not shown) other than power supply voltage VDD or power supply reference voltage VSS on source line SSL.

Configurable voltage source 500 is thereby configured such that a memory circuit, e.g., memory circuit 100, including configurable voltage source 500 sinks and sources current IRN, thereby providing current IRN, capable of generating voltages VSIG1 and VSIG2 as discussed above with respect to FIGS. 1 and 3 and is thereby capable of realizing the benefits discussed above with respect to memory circuit 100.

Figure 6:
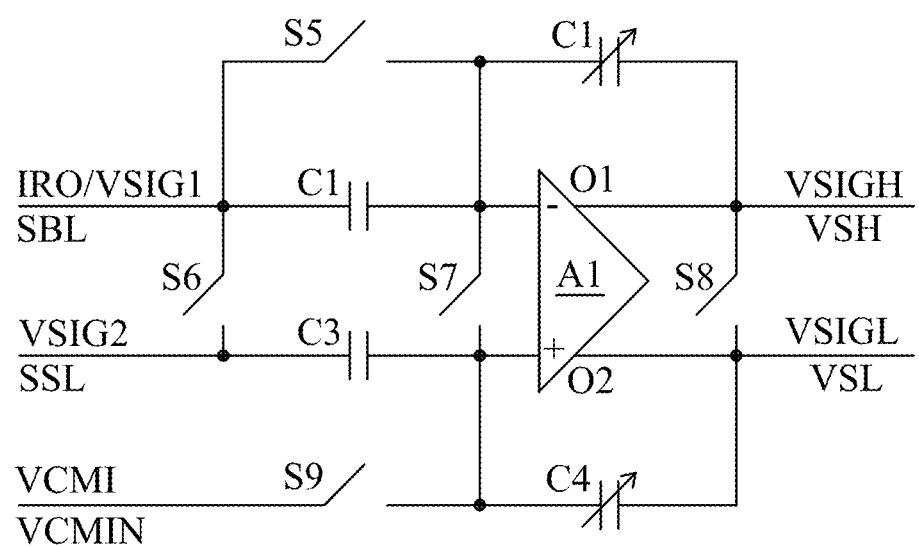
FIG. 6 is a schematic diagram of a configurable amplifier, in accordance with some embodiments.

FIG. 6 is a schematic diagram of configurable amplifier 600, in accordance with some embodiments. Configurable amplifier 600 is usable as configurable amplifier 150 discussed above with respect to FIG. 1.

Configurable amplifier 600 includes an op-amp A1, switching devices S5-S8, and capacitive devices C1-C4. Op-amp A1 includes an inverting input terminal coupled to first terminals of each of switching devices S5 and S7 and capacitive devices C1 and C2, and a non-inverting input terminal coupled to a second terminal of switching device S7 and first terminals of each of switching device S9 and capacitive devices C3 and C4.

Second terminals of each of switching device S5 and capacitive device C2, and a first terminal of switching device S6 are coupled to bit line SBL, second terminals of each of switching device S6 and capacitive device C3 are coupled to source line SSL, and a second terminal of switching device S9 is coupled to a voltage node VCMIN.

An output terminal O1 of op-amp A1 is coupled to a second terminal of capacitive device C1, a first terminal of switching device S8, and signal line VSH, and an output terminal O2 of op-amp A1 is coupled to second terminals of switching device S8 and capacitive device C4, and signal line VSL.

In the embodiment depicted in FIG. 6, configurable amplifier 600 includes op-amp A1 configured as a fully differential op-amp including differential input terminals and output terminals O1 and O2. In some embodiments, configurable amplifier 600 includes power supply voltage reference node VSSN, discussed above with respect to FIGS. 3 and 4, instead of signal line VSL, and op-amp A1 includes output terminal O1 as a single output terminal coupled to signal line VSH.

A capacitive device, e.g., one of capacitive devices C1-C4, is a capacitor, metal-oxide-semiconductor field-effect transistor (MOSFET), or similar IC device coupled between two terminals, thereby being configured to provide a low-resistance path for alternating current (AC) signals in operation such that the two terminals are considered to be capacitively coupled in some embodiments. In various embodiments, a capacitive device is configured to provide either a fixed or variable capacitance level between the two terminals.

In the embodiment depicted in FIG. 6, capacitive device C1 is configured to capacitively couple the inverting input terminal of op-amp A1 to the first output terminal of op-amp A1 through a variable capacitance level, capacitive device C2 is configured to capacitively couple the inverting input terminal of op-amp A1 to bitline SBL through a fixed capacitance level, capacitive device C3 is configured to capacitively couple the non-inverting input terminal of op-amp A1 to source line SSL through a fixed capacitance level, and capacitive device C4 is configured to capacitively couple the non-inverting input terminal of op-amp A1 to the second output terminal of op-amp A1 through a variable capacitance level.

Each of switching devices S5-S9 is configured to receive one or more control signals (not shown), e.g., one or more of control signals CTRL discussed above with respect to memory circuit 100 and FIG. 1, and selectively couple the corresponding first terminal to the corresponding second terminal responsive to the one or more control signals. Switching devices S6-S9 are configured to open and close concurrently with each other responsive to the one or more control signals.

Configurable amplifier 600 is thereby configured to be capable of operating in the first operational mode as an integrator when switching device S5 is closed, and operating in the second operational mode as an amplifier when switching device S5 is open. During a read operation in each of the first and second operational modes, configurable amplifier 600 is configured to transition from an initial state in which switching devices S6-S9 are closed to a measurement state in which switching devices S6-S9 are open, as further discussed below.

In the first operational mode, switching device S5 being closed causes the inverting input terminal of op-amp A1 to be coupled directly to bit line SBL. During the initial state of the read operation, switching device S9 being closed causes the non-inverting input terminal of op-amp A1 to be coupled directly to voltage node VCMIN configured to carry a voltage VCMI, also referred to as a virtual ground VCMI in some embodiments. Voltage VCMI on voltage node VCMIN is configurable to provide a reference voltage level suitable for common-mode operation of op-amp A1 and as the reference level of the second voltage level of voltage WLP, discussed above with respect to FIGS. 1 and 2.

During the initial state of the read operation in the first operational mode, switching devices S5-S7 and S9 being closed causes each of bit line SBL, source line SSL, and the inverting input terminal of op-amp A1 to have voltage VCMI. Switching device S8 being closed couples output terminals O1 and O2 together, thereby causing an initial voltage difference between voltages VSIGH and VSIGL to be zero.

During the transition to the measurement state, switching device S6 becoming open decouples bit line SBL from source line SLL, switching device S7 becoming open decouples the inverting and non-inverting input terminals of op-amp A1 from each other, switching device S8 becoming open decouples output terminals O1 and O2 from each other, and switching device S9 becoming open decouples the non-inverting input terminal of op-amp A1 from voltage node VCMIN. Based on switching device S5 remaining closed, current IRO causes voltage VSIG1 on bit line SBL and the inverting input terminal of op-amp A1 to move away from the level of voltage VCMI while the non-inverting input terminal of op-amp A1 is capacitively coupled to output terminal O2 through capacitive device C4, op-amp A1 thereby being configured as an integrator.

During the measurement state of the read operation in the first operational mode, a rate at which voltage VSIG1 moves away from voltage VCMI is a function of the current level of current IRO and the capacitance levels of capacitive devices C1 and C4. Based on an expected range of current levels of current IRO and targeted integration time, the capacitance levels of capacitive devices C1 and C4 are configured to cause op-amp A1 to generate voltage VSIGH on signal line VSH having a targeted voltage level range relative to voltage VSIGL generated on signal line VSL. In some embodiments, the targeted voltage level range is configured to match an input voltage range of an ADC, e.g., ADC 160 discussed above with respect to memory circuit 100 and FIG. 1.

Configurable amplifier 600 is thereby configured to generate voltages VSIGH and VSIGL having a voltage difference level indicative of the current level of current IRO, and thereby indicative of the resistance level of an OTP cell, e.g., OTP cell 112 discussed above with respect to memory circuit 100 and FIG. 1, in the read operation in the first operational mode.

In the second operational mode, switching device S5 being open causes the inverting input terminal of op-amp A1 to be decoupled from bit line SBL through switching device S5 and capacitively coupled to bit line SBL through capacitive device C2. Switching device S9 being open causes the non-inverting input terminal of op-amp A1 to be decoupled from voltage node VCMIN through switching device S9 and capacitively coupled to source line SBL through capacitive device C3.

During the initial state of the read operation in the second operational mode, switching device S6 being closed causes bit line SBL and source line SSL to have voltage VSIG1 and VSIG2 equal to each other, switching devices S7 and S9 being closed causes the inverting and non-inverting input terminals of op-amp A1 to have an initial voltage equal to voltage VCMI and having a difference equal to zero, and switching device S8 being closed couples output terminals O1 and O2 together, thereby causing an initial voltage difference between voltages VSIGH and VSIGL to be zero. In some embodiments, during the read operation in the second operational mode, source line SSL is configured to receive a reference voltage level, e.g., power supply voltage reference VSS discussed above with respect to configurable voltage source 500 and FIG. 5, such that each of voltage VSIG1 at the inverting input terminal of op-amp A1 and voltage VSIG2 at the non-inverting input terminal of op-amp A1 has the reference voltage level.

During the transition to the measurement state, switching device S6 becoming open decouples bit line SBL from source line SLL, switching devices S7 and S9 becoming open decouples the inverting and non-inverting input terminals of op-amp A1 from each other and from voltage node VCMIN, and switching device S8 becoming open decouples output terminals O1 and O2 from each other. Based on switching devices S5 and S9 being open, bit line SBL is capacitively coupled to the inverting input terminal of op-amp A1 through capacitive device C2, the inverting input terminal of op-amp A1 is capacitively coupled to output terminal O1 through capacitive device C1, source line SLL is capacitively coupled to the non-inverting input terminal of op-amp A1 through capacitive device C3, and the non-inverting input terminal of op-amp A1 is capacitively coupled to output terminal O2 through capacitive device C4, op-amp A1 thereby being configured as an amplifier.

During the measurement state of the read operation in the second operational mode, a voltage level difference of voltages VSIG1 and VSIG2 causes op-amp A1 to generate voltages VSIGH and VSIGL based on the capacitance levels of capacitive devices C1-C4. Based on an expected range of voltage levels of voltages VSIG1 and VSIG2, the capacitance levels of capacitive devices C1-C4 are configured to cause op-amp A1 to generate voltage VSIGH on signal line VSH having a targeted voltage level range relative to voltage VSIGL generated on signal line VSL. In some embodiments, the targeted voltage level range is configured to match an input voltage range of an ADC, e.g., ADC 160 discussed above with respect to memory circuit 100 and FIG. 1.

Configurable amplifier 600 is thereby configured to generate voltages VSIGH and VSIGL having a voltage difference level indicative of the voltage difference level of voltages VSIG1 and VSIG2, and thereby indicative of the resistance level of an NVM cell, e.g., NVM cell 122 discussed above with respect to memory circuit 100 and FIG. 1, in the read operation in the second operational mode.

Configurable amplifier 600 is thereby configured such that a memory circuit, e.g., memory circuit 100, including configurable amplifier 600 generates voltages VSIGH and VSIGL indicative of both current levels of current IRO and voltage levels of voltages VSGI1 and VSIG1, as discussed above with respect to FIG. 1 and is thereby capable of realizing the benefits discussed above with respect to memory circuit 100.

Figure 7:
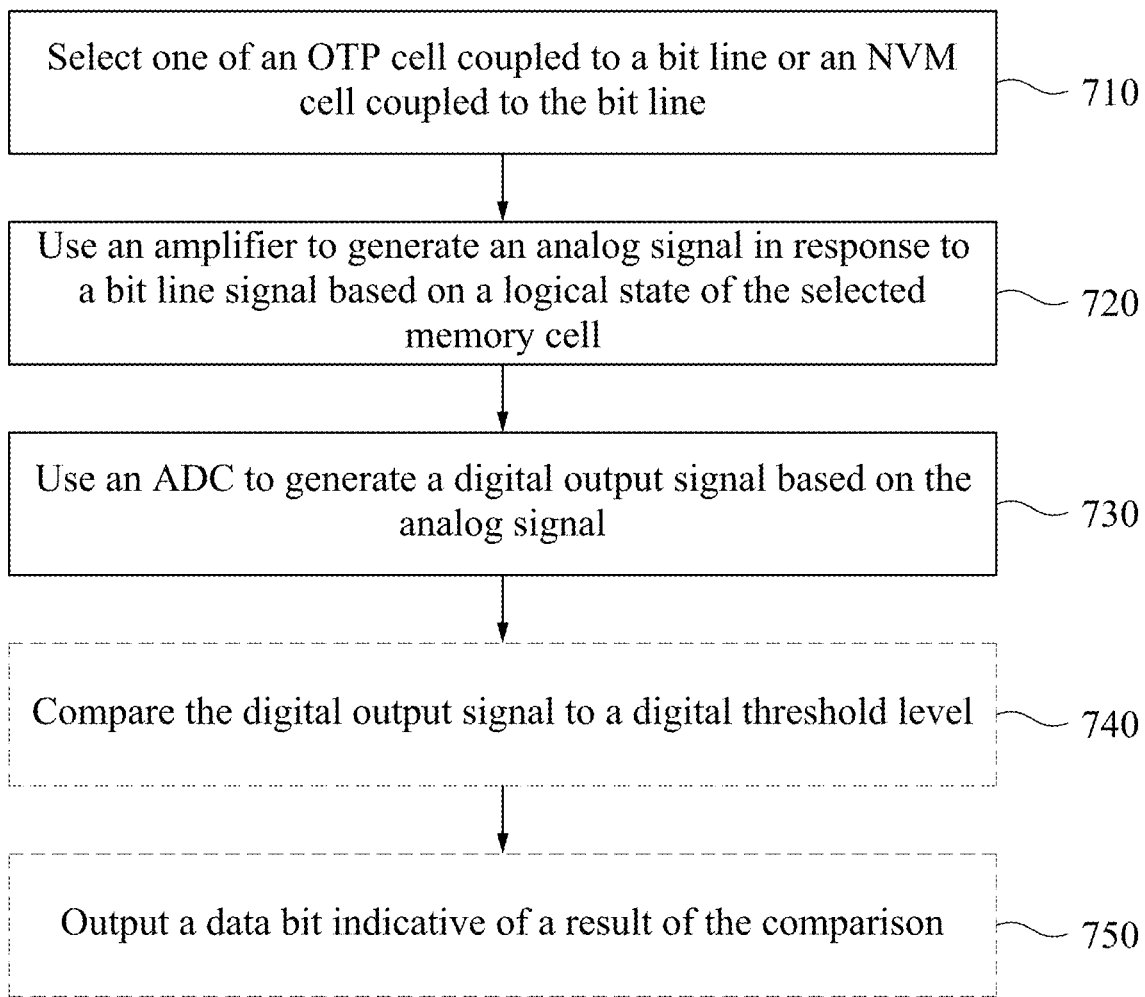
FIG. 7 is a flowchart of a method of performing a read operation on a memory circuit, in accordance with some embodiments.

FIG. 7 is a flowchart of a method 700 of performing a read operation on a memory circuit, in accordance with one or more embodiments. Method 700 is usable with a memory circuit, e.g., memory circuit 100 discussed above with respect to FIG. 1.

The sequence in which the operations of method 700 are depicted in FIG. 7 is for illustration only; the operations of method 700 are capable of being executed in sequences that differ from that depicted in FIG. 7. In some embodiments, operations in addition to those depicted in FIG. 7 are performed before, between, during, and/or after the operations depicted in FIG. 7. In some embodiments, the operations of method 700 are a subset of operations of a method of configuring a memory circuit, e.g., a method 900 discussed above with respect to FIG. 9.

At operation 710, one of an OTP cell coupled to a bit line of the memory circuit or an NVM cell coupled to the bit line is selected. Selecting the OTP cell includes selecting one OTP cell of a plurality of OTP cells, and selecting the NVM cell includes selecting one NVM cell of a plurality of NVM cells. In some embodiments, selecting the OTP cell includes selecting one of OTP cells 112 coupled to bit line SBL, and selecting the NVM cell includes selecting one of NVM cells 122 coupled to bit line SBL, each discussed above with respect to memory circuit 100 and FIG. 1.

In some embodiments, selecting the OTP cell includes receiving one or more control signals at the selected OTP cell and coupling the OTP cell to a local bit line by closing a switching device in response to the one or more control signals. In some embodiments, receiving the one or more control signals includes receiving signal WLR discussed above with respect to FIGS. 1 and 2.

In some embodiments, selecting the OTP cell coupled to the bit line includes coupling the selected OTP cell to the bit line using one or more selection circuits, e.g., selection circuit 114 discussed above with respect to memory circuit 100 and FIG. 1.

Selecting the NVM cell includes selecting the NVM cell coupled to a source line. In some embodiments, selecting the OTP cell includes receiving one or more control signals at the selected NVM cell and coupling the NVM cell to one or both of a local bit line or a local source line by closing one or more switching devices in response to the one or more control signals. In some embodiments, selecting the NVM cell includes selecting one of NVM cells 122 coupled to source line SSL discussed above with respect to memory circuit 100 and FIG. 1. In some embodiments, receiving the one or more control signals includes receiving signal WL discussed above with respect to FIGS. 1 and 3.

In some embodiments, selecting the NVM cell coupled to the bit line includes coupling the selected NVM cell to the bit line using one or more selection circuits, e.g., selection circuit 124A, and selecting the NVM cell coupled to the source line includes coupling the selected NVM cell to the source line using one or more selection circuits, e.g., selection circuit 124B, each discussed above with respect to memory circuit 100 and FIG. 1.

In some embodiments, selecting the one of the OTP cell or the NVM cell includes using a control circuit to generate one or more control signals, e.g., using control circuit 170 to generate one or more of control signals CTRL discussed above with respect to memory circuit 100 and FIG. 1.

At operation 720, an amplifier is used to generate an analog signal in response to a signal on the bit line based on a logical state of the selected memory cell. Responding to the signal includes generating the signal on the bit line based on the logical state of the selected memory cell.

In some embodiments, the selected cell is the OTP cell and generating the signal on the bit line includes receiving a gate current from the OTP cell, the gate current being indicative of the logical state of the OTP cell. Receiving the gate current includes applying a voltage to the OTP cell to generate the gate current. In some embodiments, the selected cell is OTP cell 112, and receiving the gate current includes applying signal WLP to OTP cell 112 to generate current IRO on bit line SBL as discussed above with respect to memory circuit 100 and FIG. 1.

In some embodiments, the selected cell is the NVM cell and generating the signal on the bit line includes receiving a voltage difference from the NVM cell, the voltage difference including a bit line voltage and a source line voltage and being indicative of the logical state of the NVM cell. Receiving the voltage difference includes applying a current to the NVM cell to generate the voltage difference. In some embodiments, the selected cell is NVM cell 122, and receiving the voltage difference includes applying current IRN to NVM cell 122 to generate the voltage difference between voltage VSIG1 on bit line SBL and voltage VSIG2 on source line SSL as discussed above with respect to memory circuit 100 and FIG. 1.

Using the amplifier to generate the analog signal includes configuring the amplifier to operate in a first operational mode corresponding to selecting the OTP cell or to operate in a second operational mode corresponding to selecting the NVM cell.

In some embodiments, the selected cell is the OTP cell and configuring the amplifier to operate in the first operational mode includes configuring the amplifier to operate in an integration mode. In some embodiments, configuring the amplifier to operate in the integration mode includes configuring configurable amplifier 150 to operate in the first operational mode as discussed above with respect to FIGS. 1 and 6.

In some embodiments, configuring the amplifier to operate in the integration mode includes providing a virtual ground voltage at an input terminal of the amplifier. In some embodiments, providing the virtual ground voltage at an input terminal of the amplifier includes providing voltage VCMI at the non-inverting input terminal of op-amp A1 as discussed above with respect to configurable amplifier 600 and FIG. 6.

In some embodiments, the selected cell is the NVM cell and configuring the amplifier to operate in the second operational mode includes configuring the amplifier to operate in an amplification mode. In some embodiments, configuring the amplifier to operate in the amplification mode includes configuring configurable amplifier 150 to operate in the second operational mode as discussed above with respect to FIGS. 1 and 6.

Generating the analog signal includes generating the analog signal having a magnitude indicative of a magnitude of the signal on the bit line. In some embodiments, the selected cell is the OTP cell and generating the analog signal includes generating the analog signal having the magnitude indicative of a current level of the gate current, e.g., current IRO discussed above with respect to memory circuit 100 and FIG. 1, on the bit line. In some embodiments, the selected cell is the NVM cell and generating the analog signal includes generating the analog signal having the magnitude indicative of the voltage level difference, e.g., the voltage difference between voltages VSIG1 and VSIG2 discussed above with respect to memory circuit 100 and FIG. 1.

Generating the analog signal includes outputting the analog signal on one or more signal lines. In various embodiments, outputting the analog signal includes outputting a differential signal on a pair of signal lines or outputting an individual signal on an individual signal line. In some embodiments, outputting the analog signal includes outputting voltage VSIGH on signal line VSH and voltage VSIGL on signal line VSL as discussed above with respect to FIGS. 1 and 6.

At operation 730, an ADC is used to generate a digital output signal based on the analog signal. Generating the digital output signal based on the analog signal includes receiving the analog signal on the one or more signal lines and generating the digital output signal indicative of the magnitude of the analog signal.

Generating the digital output signal includes generating the digital output signal having a predetermined number of bits. In various embodiments, generating the digital output signal includes generating the digital output signal having a fixed number of bits or generating the digital output signal having a selected one of a variable number of bits.

In some embodiments, generating the digital output signal includes generating the digital output signal on a digital bus. In some embodiments, generating the digital output signal includes generating digital output signal DOUT on digital output signal bus BDOUT as discussed above with respect to memory circuit 100 and FIG. 1.

In some embodiments, generating the digital output signal includes receiving one or more control signals, e.g., one or more of control signals CTRL discussed above with respect to FIG. 1, and performing a digitizing operation on the analog signal in response to the one or more control signals.

In some embodiments, generating the digital output signal includes receiving the digital output signal at a control circuit as part of determining one or more digital threshold levels. In various embodiments, determining the one or more digital threshold levels includes receiving digital output signals at the control circuit in response to performing one or more pluralities of read operations on a plurality of OTP cells programmed to the first logical state, a plurality of OTP cells programmed to the second logical state, a plurality of NVM cells programmed to the first logical state, or a plurality of NVM cells programmed to the second logical state.

In some embodiments, determining the one or more digital threshold levels includes using the control circuit to store the one or more digital threshold levels in a storage device, e.g., OTP section 110 or NVM section 120 discussed above with respect to memory circuit 100 and FIG. 1.

At operation 740, in some embodiments, the digital output signal is compared to a digital threshold level. Comparing the digital output signal to the digital threshold level includes receiving the digital output signal and the digital threshold level at a digital comparator, and using the digital comparator to perform the comparison. In some embodiments, receiving the digital output signal and the digital threshold level at the digital comparator and using the digital comparator to perform the comparison includes using digital comparator 180 as discussed above with respect to memory circuit 100 and FIG. 1.

Receiving the digital output signal and the digital threshold level at the digital comparator includes receiving the digital output signal on a digital bus, e.g., digital output signal bus BDOUT discussed above with respect to FIG. 1, and receiving the digital threshold level on a digital signal bus, e.g., digital threshold bus BTHLD discussed above with respect to FIG. 1.

In some embodiments, comparing the digital output signal to the digital threshold level includes selecting the digital threshold level from a plurality of digital threshold levels based on the selected cell being the OTP cell or the NVM cell. In some embodiments, selecting the digital threshold level from the plurality of digital threshold levels includes selecting digital threshold THLD1 when the selected cell is an OTP cell 112 and selecting digital threshold THLD2 when the selected cell is an NVM cell 122 as discussed above with respect to memory circuit 100 and FIG. 1.

In some embodiments, selecting the digital threshold level from the plurality of digital threshold levels includes selecting the digital threshold based on an operating scenario of the memory circuit, e.g., an operating temperature or location of the selected cell.

In some embodiments, receiving the digital threshold level at the digital comparator includes receiving a first digital threshold level at a control circuit, modifying the first digital threshold level, e.g., based on an operating temperature of the memory circuit, to generate a second digital threshold level, and outputting the second digital threshold level to the digital comparator.

In various embodiments, comparing the digital output signal to the digital threshold level includes comparing the digital output signal and the digital threshold level having a same or differing number of bits. In various embodiments, comparing the digital output signal to the digital threshold level includes comparing an entirety or a subset of a total number of bits of one or both of the digital output signal or the digital threshold level.

At operation 750, in some embodiments, a data bit is output indicative of a result of the comparison of the digital output signal to the threshold level. Outputting the data bit includes using the digital comparator to generate the data bit. In some embodiments, using the digital comparator includes using digital comparator 180 to generate output bit BR on output terminal BT as discussed above with respect to memory circuit 100 and FIG. 1.

In some embodiments, outputting the data bit is part of outputting a plurality of data bits corresponding to a plurality of read operations performed in series.

By executing some or all of the operations of method 700, a read operation is performed in which either an OTP cell generates a current signal on a bit line or an NVM cell generates a voltage signal on the bit line, an amplifier generates an analog voltage based on either bit line signal type, and an ADC generates a digital output signal representative of a logical state of the selected OTP or NVM cells, thereby obtaining the benefits discussed above with respect to memory circuit 100.

Figure 8:
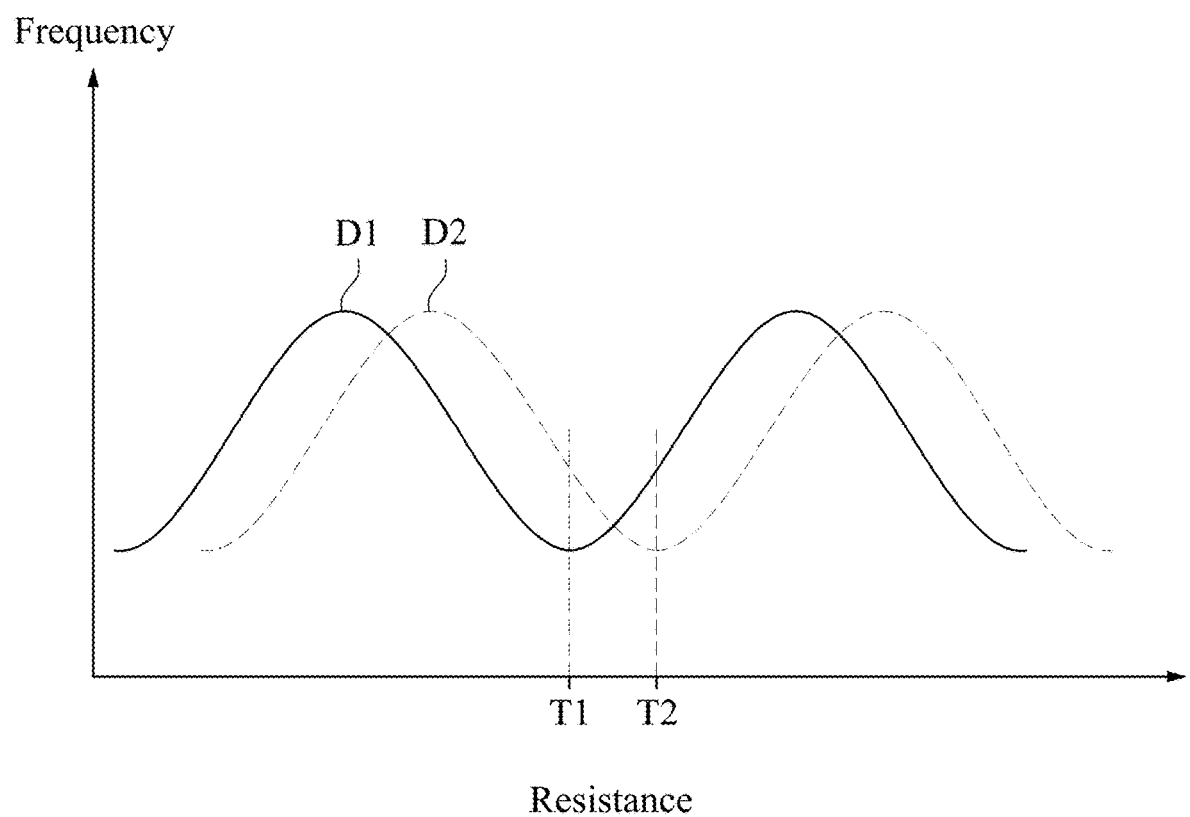
FIG. 8 is a representation of memory circuit operating parameters, in accordance with some embodiments.

FIG. 8 is a representation of memory circuit operating parameters, in accordance with some embodiments. FIG. 8 includes an x-axis representing resistance values, a y-axis representing a relative frequency of memory cells having resistance levels corresponding to the resistance values, and resistance distributions D1 and D2.

Each of resistance distributions D1 and D2 includes two groupings of relatively large frequencies representing the first and second memory cell resistance levels discussed above with respect to FIGS. 1-7. A threshold level T1 represents a resistance value between the two groupings of resistance distribution D1, and a threshold level T2 represents a resistance value between the two groupings of resistance distribution D2.

In some embodiments, resistance distribution D1 corresponds to one of a plurality of OTP cells, e.g., OTP cells 112 discussed above with respect to FIG. 1, or a plurality of NVM cells, e.g., NVM cells 122 discussed above with respect to FIG. 1, and resistance distribution D2 corresponds to the other of the plurality of OTP cells or the plurality of NVM cells. In some embodiments, threshold level T1 corresponds to one of digital threshold levels THLD1 or THLD2, and threshold level T2 corresponds to the other of digital threshold levels THLD1 or THLD2, each discussed above with respect to FIG. 1.

In various embodiments, resistance distributions D1 and D2 correspond to a single one of the plurality of OTP cells or the plurality of NVM cells under separate operating scenarios, e.g., different operating temperatures, cell locations, or over a given period of time or level of usage, of the memory circuit. In such embodiments, threshold levels T1 and T2 represent shifts in the operating parameters corresponding to selecting a threshold level based on an operating scenario as discussed above with respect to method 700 and FIG. 7, and determining a threshold level based on an operating scenario as discussed below with respect to method 900 and FIG. 9.

Figure 9:
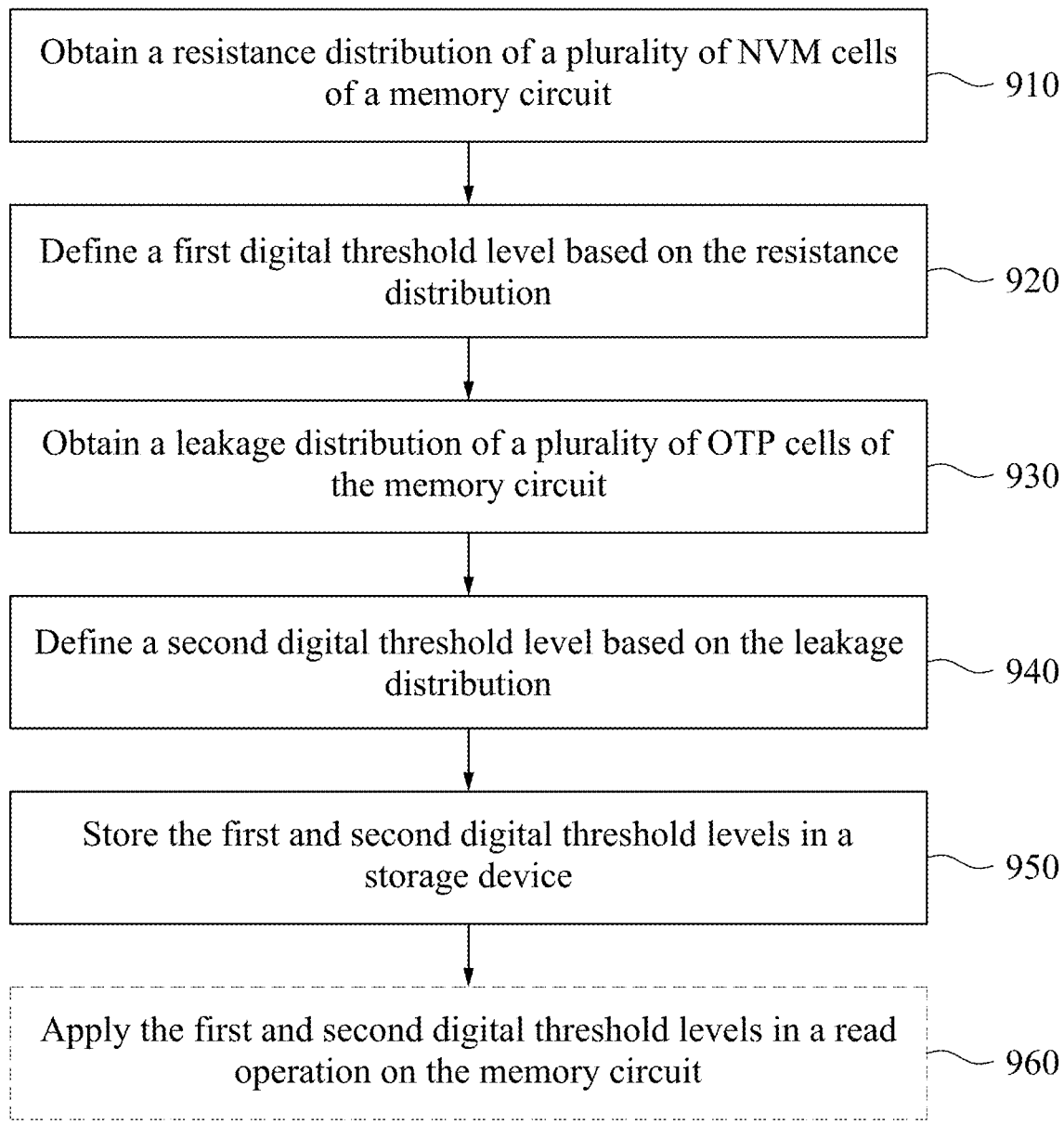
FIG. 9 is a flowchart of a method of configuring a memory circuit, in accordance with some embodiments.

FIG. 9 is a flowchart of method 900 of configuring a memory circuit, in accordance with some embodiments. Method 900 is usable with a memory circuit, e.g., memory circuit 100 discussed above with respect to FIG. 1. Some or all of the operations of method 900 are performed by a controller, e.g., a control circuit such as control circuit 170 of memory circuit 100 discussed above with respect to FIG. 1 and/or a controller external to the memory circuit. In some embodiments, one or more operations of method 900 are performed by a user of the memory circuit, e.g., through a control circuit interface.

The sequence in which the operations of method 900 are depicted in FIG. 9 is for illustration only; the operations of method 900 are capable of being executed in sequences that differ from that depicted in FIG. 9. In some embodiments, operations in addition to those depicted in FIG. 9 are performed before, between, during, and/or after the operations depicted in FIG. 9. In some embodiments, the operations of method 900 are a subset of operations of a method of operating a memory circuit.

At operation 910, a resistance distribution of a plurality of NVM cells of the memory circuit is obtained. Obtaining the resistance distribution includes performing a plurality of read operations on the plurality of NVM cells, thereby obtaining a corresponding plurality of resistance values. In some embodiments, obtaining the resistance distribution of the plurality of NVM cells includes obtaining the resistance distribution of NVM cells 122 discussed above with respect to memory circuit 100 and FIG. 1.

Obtaining the resistance distribution of the plurality of NVM cells includes performing a first plurality of read operations with the plurality of NVM cells programmed to a first logical state corresponding to a first resistance level, and performing a second plurality of read operations with the plurality of NVM cells programmed to a second logical state corresponding to a second resistance level.

In some embodiments, obtaining the resistance distribution of the plurality of NVM cells includes performing one or more write operations on the plurality of NVM cells, thereby programming each NVM cell of the plurality of NVM cells to one or both of the first or second logical states.

In various embodiments, obtaining the resistance distribution of the plurality of NVM cells includes the plurality of NVM cells being an entirety or a subset of the NVM cells of the memory circuit.

In some embodiments, obtaining the resistance distribution of the plurality of NVM cells includes performing a first plurality of read operations under a first operating scenario, e.g., a first operating temperature, cell location, time, or usage level, and performing one or more additional pluralities of read operations under one or more additional operating scenarios, e.g., one or more additional operating temperatures, cell locations, times, or usage levels.

In some embodiments, obtaining the resistance distribution of the plurality of NVM cells includes obtaining one or both of resistance distributions D1 or D2 discussed above with respect to FIG. 8.

In various embodiments, obtaining the resistance distribution of the plurality of NVM cells includes using a control circuit of the memory circuit, e.g., control circuit 170 discussed above with respect to FIG. 1, a circuit external to the memory circuit, or a combination of the control circuit and the external circuit.

At operation 920, a first digital threshold level based on the resistance distribution is defined. Defining the first digital threshold level includes defining a resistance value corresponding to the first digital threshold level such that the plurality of resistance values of the resistance distribution of the plurality of NVM cells is divided into a first grouping corresponding to the first resistance level and first logical state and a second grouping corresponding to the second resistance level and second logical state. In some embodiments, defining the first digital threshold level includes defining digital threshold level THLD2 discussed above with respect to memory circuit 100 and FIG. 1.

In some embodiments, the first grouping overlaps the second grouping, and defining the resistance value capable of separating the resistance distribution into first and second groupings includes separating the overlapping groupings by removing measurements of one or more NVM cells of the plurality of NVM cells from the resistance distribution. In some embodiments, defining the first digital threshold level includes causing the one or more NVM cells having measurements removed from the resistance distribution to be disabled during read and write operations on the memory circuit.

In some embodiments, defining the first digital threshold level includes defining the first digital threshold level under the first operating scenario and defining one or more additional digital threshold levels under the one or more additional operating scenarios.

In some embodiments, defining the first digital threshold level includes defining one or both of threshold levels T1 or T2 discussed above with respect to FIG. 8.

In various embodiments, defining the first digital threshold level includes using the control circuit of the memory circuit, e.g., control circuit 170 discussed above with respect to FIG. 1, a circuit external to the memory circuit, or a combination of the control circuit and the external circuit.

In some embodiments, defining the first digital threshold level includes receiving the first digital threshold level from a memory circuit user, e.g., through a control circuit interface.

At operation 930, a leakage distribution of a plurality of OTP cells of the memory circuit is obtained. Obtaining the leakage distribution includes performing a plurality of read operations on the plurality of OTP cells, thereby obtaining a corresponding plurality of leakage values. In some embodiments, obtaining the leakage distribution of the plurality of OTP cells includes obtaining the leakage distribution of OTP cells 112 discussed above with respect to memory circuit 100 and FIG. 1.

Obtaining the leakage distribution of the plurality of OTP cells includes performing a first plurality of read operations with the plurality of OTP cells having an initial logical state corresponding to a first leakage level, and performing a second plurality of read operations with the plurality of OTP cells programmed to the permanently altered second logical state corresponding to a second leakage level.

Obtaining the leakage distribution of the plurality of OTP cells includes the plurality of OTP cells being a first subset of the OTP cells of the memory circuit, and performing the second plurality of read operations includes performing the second plurality of read operations on the subset of OTP cells. In various embodiments, performing the first plurality of read operations on the plurality of OTP cells includes performing the first plurality of read operations on the first subset of OTP cells, an entirety of the OTP cells of the memory circuit, or a second subset of the OTP cells of the memory circuit.

In some embodiments, obtaining the leakage distribution of the plurality of OTP cells includes performing write operations on the plurality of OTP cells, thereby programming each OTP cell of the plurality of OTP cells to the second logical state.

In some embodiments, obtaining the leakage distribution of the plurality of OTP cells includes performing additional operations analogous to those discussed above with respect to measuring the resistance distribution of the plurality of NVM cells in operation 910, and additional details are therefore not repeated.

At operation 940, a second digital threshold level based on the leakage distribution is defined. In some embodiments, defining the second digital threshold level includes defining digital threshold level THLD1 discussed above with respect to memory circuit 100 and FIG. 1.

Defining the second digital threshold is performed in a manner analogous to that of defining the first digital threshold level discussed above with respect to operation 920; thus, further description is not repeated.

At operation 950, the first and second digital threshold levels are stored in a storage device. In various embodiments, storing the first and second digital threshold levels includes one or more of storing the first and second digital threshold levels in OTP cells of the memory circuit, NVM cells of the memory circuit, or a storage device separate from the OTP and NVM cells. In some embodiments, storing the first and second digital threshold levels includes storing the first and second digital threshold levels in one or both of OTP cells 112 or NVM cells 122 of memory circuit 100 discussed above with respect to FIG. 1.

In some embodiments, the plurality of OTP cells of the memory circuit used for obtaining the leakage distribution is a first plurality of OTP cells, and storing the first and second threshold levels in the storage device includes storing the first and second threshold levels in a second plurality of OTP cells.

In some embodiments, storing the first and second digital threshold levels includes storing the first and second digital threshold levels corresponding to the first operating scenario and storing one or more additional digital threshold levels corresponding to one or more additional operating scenarios. In some embodiments storing the first and second digital threshold levels includes storing the first and second digital threshold levels in OTP cells of the memory circuit, and storing the one or more additional digital threshold levels includes storing the one or more additional digital threshold levels in NVM cells of the memory circuit.

In some embodiments, storing the first and second digital threshold levels is part of a manufacturing operation in which the memory circuit or a system including the memory circuit is configured, e.g., numbers of OTP and/or NVM cells are determined. In some embodiments, storing the first and second digital threshold levels includes storing, in the OTP cells of the memory circuit, the first and second digital threshold levels in addition to manufacturing information, e.g., an identifier such as a serial number, circuit configuration or trimming data, or the like.

In some embodiments, storing the first and second digital threshold levels is part of performing an update, e.g., a calibration, operation on the memory circuit or a system including the memory circuit.

At operation 960, in some embodiments, the first and second digital threshold levels are applied in a read operation on the memory circuit. In some embodiments, applying the first and second digital threshold levels in a read operation includes performing some or all of method 700 discussed above with respect to FIG. 7.

By executing some or all of the operations of method 900, a memory circuit is configured to be capable of performing read operations in which a digital output signal is representative of a logical state of a selected OTP or NVM cell, thereby obtaining the benefits discussed above with respect to memory circuit 100. Further, by executing some or all of the operations of method 900, the memory circuit is used to determine and store at least one threshold level for each of the OTP and NVM cell types. Compared to approaches in which predetermined threshold levels are used, the memory circuit thereby improves accuracy and yield by setting the threshold levels based on measured memory cell parameters that vary as a function of temperature, time, and manufacturing process tolerances.

In some embodiments, a circuit includes an OTP cell, an NVM cell, a bit line coupled to the OTP cell and to the NVM cell, an amplifier including a first input terminal coupled to the bit line, the amplifier configured to generate an output voltage based on a signal on the bit line, an ADC configured to generate a digital output signal based on the output voltage, and a comparator including a first input port coupled to an output port of the ADC, wherein the comparator is configured to output a data bit responsive to a comparison of the digital output signal to a threshold level received at a second input port. In some embodiments, the first input terminal of the amplifier is coupled to the bit line through a switching device in parallel with a capacitive device. In some embodiments, the amplifier includes a second input terminal coupled to a virtual ground voltage source through a switching device. In some embodiments, the second input terminal of the amplifier is further coupled to a source line through a capacitive device, and the source line is coupled to the NVM cell. In some embodiments, the circuit includes a storage device configured to store the threshold level. In some embodiments, the circuit includes a control circuit configured to generate and store the threshold level in the storage device. In some embodiments, the storage device includes a plurality of OTP cells, and the OTP cell is one OTP cell of the plurality of OTP cells. In some embodiments, the NVM cell comprises an MTJ.

In some embodiments, a method of performing a read operation on a memory circuit includes selecting one of an OTP cell coupled to a bit line or an NVM cell coupled to the bit line, using an amplifier to generate an analog signal in response to a signal on the bit line based on a logical state of the selected OTP or NVM cell, and using an ADC to generate a digital output signal based on the analog signal. In some embodiments, selecting the one of the OTP cell or the NVM cell includes selecting the OTP cell, and using the amplifier to generate the analog signal in response to the signal on the bit line includes receiving a gate current from the OTP cell and configuring the amplifier to operate in an integration mode. In some embodiments, configuring the amplifier to operate in the integration mode includes providing a virtual ground voltage at an input terminal of the amplifier. In some embodiments, selecting the one of the OTP cell or the NVM cell includes selecting the NVM cell, and using the amplifier to generate the analog signal in response to the signal on the bit line includes receiving a voltage difference from the NVM cell and configuring the amplifier to operate in an amplification mode. In some embodiments, the method includes comparing the digital output signal to a digital threshold level and outputting a data bit indicative of a result of comparing the digital output signal to the digital threshold level. In some embodiments, comparing the digital output signal to the digital threshold level includes selecting the digital threshold level from a plurality of digital threshold levels based on selecting the one of the OTP cell or the NVM cell.

In some embodiments, a method of configuring a memory circuit includes obtaining a resistance distribution of a plurality of MTJ memory cells of the memory circuit, defining a first digital threshold level based on the resistance distribution, obtaining a leakage distribution of a plurality of OTP cells of the memory circuit, defining a second digital threshold level based on the leakage distribution, and storing the first and second digital threshold levels in a storage device. In some embodiments, obtaining the resistance distribution includes obtaining a first resistance distribution based on a first programmed state of each MTJ memory cell of the plurality of MTJ memory cells, and obtaining a second resistance distribution based on a second programmed state of each MTJ memory cell of the plurality of MTJ memory cells. In some embodiments, obtaining the leakage distribution includes obtaining a first leakage distribution based on a non-programmed state of each OTP memory cell of the plurality of OTP cells, and obtaining a second resistance distribution based on a programmed state of a subset of the plurality of OTP cells. In some embodiments, the plurality of OTP cells of the memory circuit is a first plurality of OTP cells, and storing the first and second digital threshold levels in the storage device includes storing the first and second digital threshold levels in a second plurality of OTP cells. In some embodiments, each of obtaining the resistance distribution of the plurality of MTJ memory cells and obtaining the leakage distribution of the plurality of OTP cells is performed under a first operating scenario, and the method includes obtaining another resistance distribution of the plurality of MTJ memory cells under a second operating scenario, defining a third digital threshold level based on the another resistance distribution, obtaining another leakage distribution of the plurality of OTP cells under the second operating scenario, defining a fourth digital threshold level based on the another leakage distribution, and storing the third and fourth digital threshold levels in the storage device. In some embodiments, the first operating scenario includes a first temperature, and the second operating scenario includes a second temperature different from the first temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
    a one-time programmable (OTP) cell;
    a non-volatile memory (NVM) cell;
    a bit line coupled to the OTP cell and the NVM cell;
    an amplifier comprising a first input terminal coupled to the bit line, the amplifier configured to generate an output voltage based on a signal on the bit line;
    an analog-to-digital converter (ADC) configured to generate a digital output signal based on the output voltage; and
    a comparator comprising a first input port coupled to an output port of the ADC, wherein the comparator is configured to output a data bit responsive to a comparison of the digital output signal to a threshold level received at a second input port.

2. The circuit of claim 1, wherein the first input terminal of the amplifier is coupled to the bit line through a switching device in parallel with a capacitive device.

3. The circuit of claim 1, wherein the amplifier comprises a second input terminal coupled to a virtual ground voltage source through a switching device.

4. The circuit of claim 3, wherein
    the second input terminal of the amplifier is further coupled to a source line through a capacitive device, and
    the source line is coupled to the NVM cell.

5. The circuit of claim 1, further comprising a storage device configured to store the threshold level.

6. The circuit of claim 5, further comprising a control circuit configured to generate and store the threshold level in the storage device.

7. The circuit of claim 5, wherein
    the storage device comprises a plurality of OTP cells, and
    the OTP cell is one OTP cell of the plurality of OTP cells.

8. The circuit of claim 1, wherein the NVM cell comprises a magnetic tunnel junction (MTJ).

9. A method of performing a read operation on a memory circuit, the method comprising:
    selecting one of a one-time programmable (OTP) cell coupled to a bit line or a non-volatile memory (NVM) cell coupled to the bit line;
    using an amplifier to generate an analog signal in response to a signal on the bit line based on a logical state of the selected OTP or NVM cell; and
    using an analog-to-digital-converter (ADC) to generate a digital output signal based on the analog signal.

10. The method of claim 9, wherein
    the selecting the one of the OTP cell or the NVM cell comprises selecting the OTP cell, and
    the using the amplifier to generate the analog signal in response to the signal on the bit line comprises:
        receiving a gate current from the OTP cell; and
        configuring the amplifier to operate in an integration mode.

11. The method of claim 10, wherein the configuring the amplifier to operate in the integration mode comprises providing a virtual ground voltage at an input terminal of the amplifier.

12. The method of claim 9, wherein
    the selecting the one of the OTP cell or the NVM cell comprises selecting the NVM cell, and
    the using the amplifier to generate the analog signal in response to the signal on the bit line comprises:

receiving a voltage difference from the NVM cell; and
configuring the amplifier to operate in an amplification mode.

13. The method of claim 9, further comprising:
comparing the digital output signal to a digital threshold level; and
outputting a data bit indicative of a result of the comparing the digital output signal to the digital threshold level.

14. The method of claim 13, wherein the comparing the digital output signal to the digital threshold level comprises selecting the digital threshold level from a plurality of digital threshold levels based on the selecting the one of the OTP cell or the NVM cell.

15. A method of configuring a memory circuit, the method comprising:
obtaining a resistance distribution of a plurality of magnetic tunnel junction (MTJ) memory cells of the memory circuit;
defining a first digital threshold level based on the resistance distribution;
obtaining a leakage distribution of a plurality of one-time programmable (OTP) cells of the memory circuit;
defining a second digital threshold level based on the leakage distribution; and
storing the first and second digital threshold levels in a storage device.

16. The method of claim 15, wherein the obtaining the resistance distribution comprises:
obtaining a first resistance distribution based on a first programmed state of each MTJ memory cell of the plurality of MTJ memory cells; and
obtaining a second resistance distribution based on a second programmed state of each MTJ memory cell of the plurality of MTJ memory cells.

17. The method of claim 15, wherein the obtaining the leakage distribution comprises:
obtaining a first leakage distribution based on a non-programmed state of each OTP memory cell of the plurality of OTP cells; and
obtaining a second resistance distribution based on a programmed state of a subset of the plurality of OTP cells.

18. The method of claim 15, wherein
the plurality of OTP cells of the memory circuit is a first plurality of OTP cells, and
the storing the first and second digital threshold levels in the storage device comprises storing the first and second digital threshold levels in a second plurality of OTP cells.

19. The method of claim 15, wherein
each of the obtaining the resistance distribution of the plurality of MTJ memory cells and the obtaining the leakage distribution of the plurality of OTP cells is performed under a first operating scenario, and
the method further comprises:
obtaining another resistance distribution of the plurality of MTJ memory cells under a second operating scenario;
defining a third digital threshold level based on the another resistance distribution;
obtaining another leakage distribution of the plurality of OTP cells under the second operating scenario;
defining a fourth digital threshold level based on the another leakage distribution; and
storing the third and fourth digital threshold levels in the storage device.

20. The method of claim 19, wherein the first operating scenario comprises a first temperature, and the second operating scenario comprises a second temperature different from the first temperature.

* * * * *